(12) United States Patent
Lee et al.

(10) Patent No.: US 11,199,767 B2
(45) Date of Patent: *Dec. 14, 2021

(54) APPARATUS AND METHOD FOR GENERATING AN ELECTROMAGNETIC RADIATION

(71) Applicant: TAIWAN SEMICONDUCTOR MANUFACTURING COMPANY LTD., Hsinchu (TW)

(72) Inventors: Chung-Chieh Lee, Taipei (TW); Feng Yuan Hsu, Yilan County (TW); Chyi Shyuan Chern, Taipei (TW); Chi-Ming Yang, Hsinchu (TW); Tsiao-Chen Wu, Hsinchu County (TW); Chun-Lin Chang, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/713,964

(22) Filed: Dec. 13, 2019

(65) Prior Publication Data
US 2020/0117076 A1   Apr. 16, 2020

Related U.S. Application Data

(63) Continuation of application No. 15/992,017, filed on May 29, 2018, now Pat. No. 10,509,311.

(51) Int. Cl.
G03F 1/24      (2012.01)
G03F 1/52      (2012.01)
G03F 7/20      (2006.01)

(52) U.S. Cl.
CPC ............... *G03F 1/24* (2013.01); *G03F 1/52* (2013.01); *G03F 7/7015* (2013.01)

(58) Field of Classification Search
CPC ............ G03F 1/52; G03F 1/24; G03F 7/7015
USPC ................... 250/493.1, 494.1, 504 R
See application file for complete search history.

(56) References Cited

U.S. PATENT DOCUMENTS 10,509,311 B1*  12/2019  Lee ................. G03F 7/70916
2008/0099699 A1*  5/2008  Yabuta ............. G03F 7/70916
                                                       250/504 R

* cited by examiner

*Primary Examiner* — Nicole M Ippolito
(74) *Attorney, Agent, or Firm* — WPAT, P.C., Intellectual Property Attorneys; Anthony King (57) ABSTRACT

A method for generating an electromagnetic radiation includes the following operations. A target material is introduced in a chamber. A light beam is irradiated on the target material in the chamber to generate plasma and an electromagnetic radiation. The electromagnetic radiation is collected with an optical device. A gas mixture is introduced in the chamber. The gas mixture includes a first buffer gas reactive to the target material, and a second buffer gas to slow down debris of the target material and/or plasma by-product, so as to increase an reaction efficiency of the target material and the first buffer gas, and to reduce deposition of the debris of the target material and/or the plasma by-product on the optical device.

20 Claims, 6 Drawing Sheets

APPARATUS AND METHOD FOR GENERATING AN ELECTROMAGNETIC RADIATION

PRIORITY CLAIM AND CROSS-REFERENCE

This application is a continuation of U.S. patent application Ser. No. 15/992,017, filed on May 29, 2018, entitled of "APPARATUS AND METHOD FOR GENERATING AN ELECTROMAGNETIC RADIATION", the disclosure of which is hereby incorporated by reference in its entirety.

BACKGROUND

Extreme-ultraviolet (EUV) light is an electromagnetic radiation, e.g., having a wavelength range lower than about 100 nanometers or less. EUV light has been used in photolithography operation as an exposure light source to fabricate extremely small features.

The EUV light can be formed along with plasma by irradiating a target material with a laser beam, and the generated EUV light is then collected and transmitted to an exposure system by an optical device. During generation of the plasma and EUV light, however, debris of the target material and plasma by-product such as ions of the target material tend to deposit on the optical device, thereby damaging the optical device and deteriorating its optical performance.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The advanced lithography process, method, and materials described in the current disclosure can be used in many applications, including fin-type field effect transistors (Fin- FETs). For example, the fins may be patterned to produce a relatively close spacing between features, for which the above disclosure is well suited. In addition, spacers used in forming fins of FinFETs can be processed according to the above disclosure.

In one or more embodiments of the present disclosure, a method and an apparatus for generating an electromagnetic radiation such as EUV light is provided. The method includes introducing a gas mixture into the chamber during operation of generating the EUV light. The gas mixture includes a first buffer gas and a second buffer gas. The first buffer gas is configured to react with a target material to form a gaseous product, which can be exhausted from the chamber to reduce deposition of the debris on an optical device and/or on the inner wall of the chamber. The second buffer gas having a larger molecular mass, gas density and viscosity than that of the first buffer gas, and is configured to help slow down debris of the target material and/or plasma by-product, so as to increase the reaction efficiency of the target material and the first buffer gas, and to reduce deposition of the target material and/or plasma by-product. The second buffer gas can also be excited to emit an EUV light, and thus can also help to increase the amount of EUV light.

Figure 1:
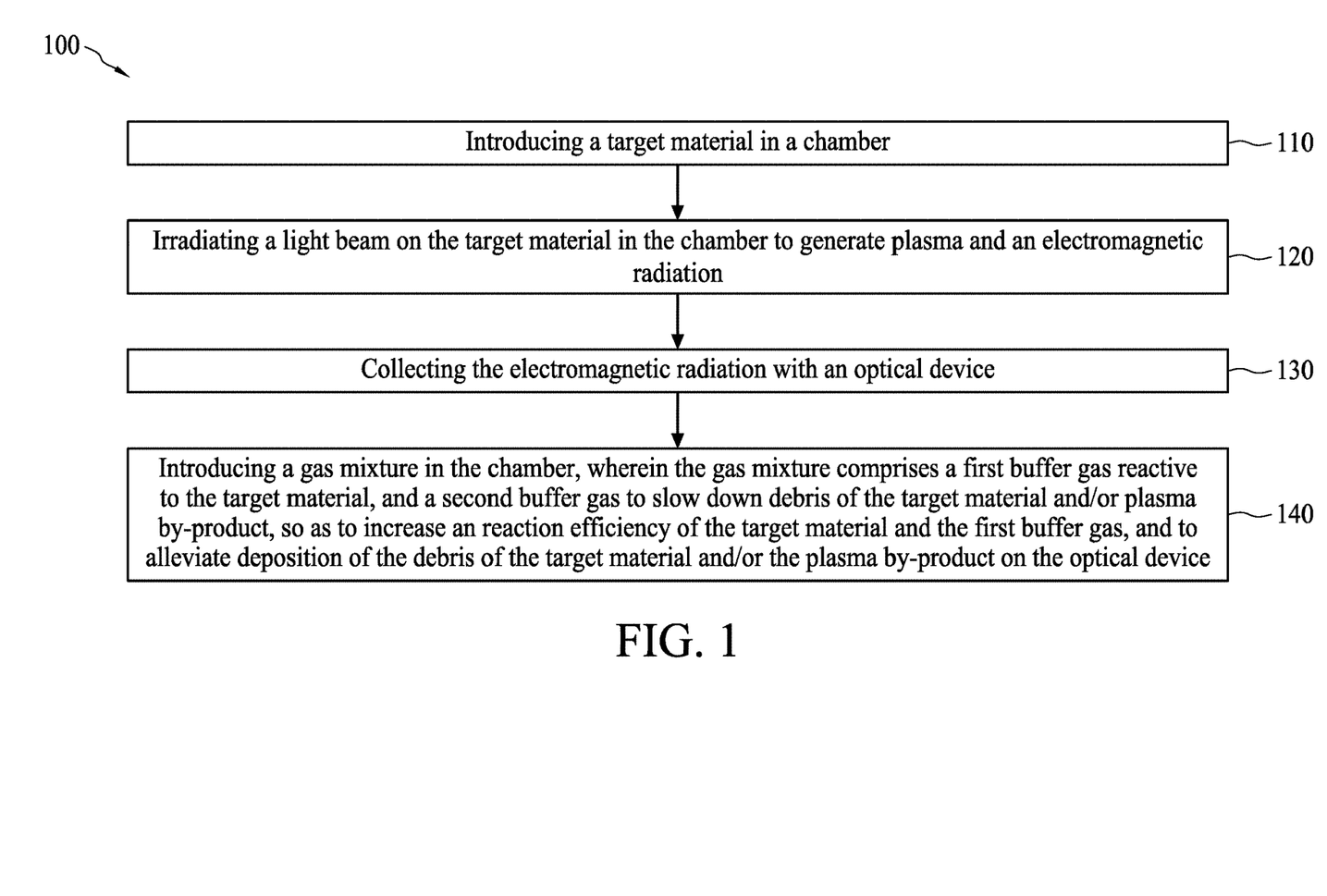
FIG. 1 is a flow chart illustrating a method for generating an electromagnetic radiation according to various aspects of one or more embodiments of the present disclosure.

FIG. 1 is a flow chart illustrating a method for generating an electromagnetic radiation according to various aspects of one or more embodiments of the present disclosure. The method 100 begins with operation 110 in which a target material is introduced in a chamber. The method 100 proceeds with operation 120 in which a light beam is irradiated on the target material in the chamber to generate plasma and an electromagnetic radiation. The method 100 proceeds with operation 130 in which the electromagnetic radiation is collected with an optical device. The method 100 proceeds with operation 140 in which a gas mixture is introduced in the chamber. The gas mixture includes a first buffer gas reactive to the target material, and a second buffer gas to slow down debris of the target material and/or plasma by-product, so as to increase an reaction efficiency of the target material and the first buffer gas, and to alleviate deposition of the debris of the target material and/or the plasma by-product on the optical device.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
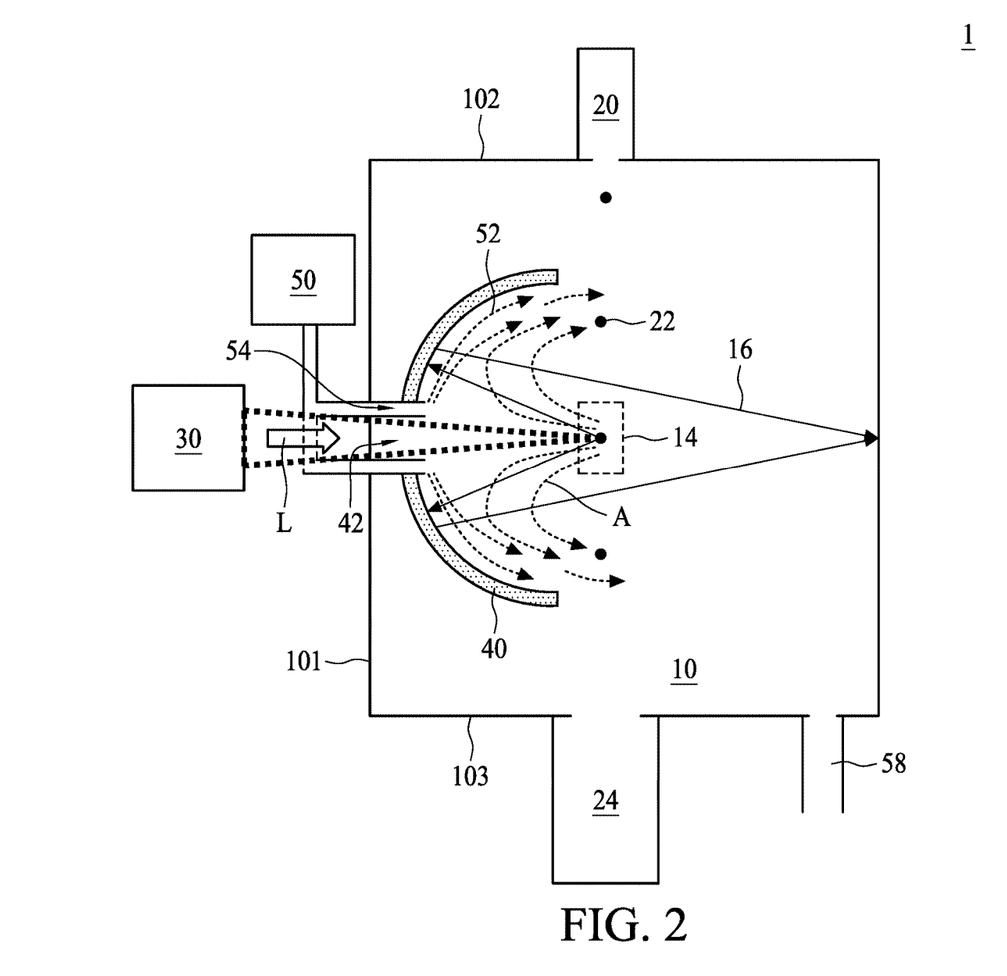
FIG. 2 is a schematic diagram illustrating an apparatus in accordance with some embodiments of the present disclosure.

FIG. 2 is a schematic diagram illustrating an apparatus in accordance with some embodiments of the present disclosure. As shown in FIG. 2, the apparatus 1 for generating an electromagnetic radiation 16 includes a chamber 10, a target material supplier 20, a light source system 30, an optical device 40 and a buffer gas supplier 50. In some embodiments, the apparatus 1 is designed to generate an electromagnetic radiation 16 such as an extreme-ultraviolet (EUV) light (also referred to as soft x-rays), having a wavelength range lower than about 100 nanometers, but is not necessarily limited thereto. By way of example, an EUV light having a wavelength of about 13.5 nm can be generated. During operation, the chamber 10 may be maintained at a low-pressure state or vacuum state.

The target material supplier 20 is connected to the chamber 10 and configured to supply a target material 22 to the chamber 10. The target material 22 may be selected based on the wavelength of the EUV light to be generated. For example, the target material 22 may include tin, and the EUV light having a wavelength of about 13.5 nm can be generated. In some other embodiments, lithium or other suitable target material can be selected to generate an EUV light having a different wavelength. The target material 22 may be introduced to the chamber 10 in the form of a droplet, a stream, a cluster or the like.

The light source system 30 is configured to emit a light beam L on the target material 22. The target material 22 can be excited by the light beam L, and converted into a plasma state, with generation of electromagnetic radiation 16 within EUV wavelength range. In some embodiments, the light beam L may include a pulse light. In some embodiments, the light source system 30 may include a laser source system 30 configured to emit a laser beam. The laser beam may include, for example, $CO_2$ laser or the like. The wavelength of $CO_2$ laser may be within a middle infra-red wavelength range, e.g., within the range of about 9 micrometers to about 11 micrometers. $CO_2$ laser may produce relatively high conversion efficiency on some target material such as tin.

The electromagnetic radiation 16 is generated during de-excitation and recombination of ions emitted from the plasma. The optical device 40 is disposed in the chamber 10 and configured to collect the electromagnetic radiation 16. In some embodiments, the optical device 40 can collect and direct the electromagnetic radiation 16 toward an exposure light source system in a photolithography apparatus. In some embodiments, the optical device 40 may include a reflector mirror, which can reflect the electromagnetic radiation 16, and focus the electromagnetic radiation 16 to a focus point. By way of example, the optical device 40 may include a multi-layer mirror (MLM) capable of reflecting EUV light within a designated wavelength range.

In some embodiments, the buffer gas supplier 50 includes a gas outlet 54 connected to a first side 101 of the chamber 10, and the gas mixture 52 is introduced to the chamber 10 from the first side 101. The light source system 30 may be disposed on the first side 101 of the chamber 10, and the light beam L may be emitted to the chamber 10 from the first side 101. In some embodiments, the optical device 40 is disposed near the first side 101 of the chamber 10, and the light beam L can be emitted to the chamber 10 through an aperture 42 of the optical device 40. The gas outlet 54 of the buffer gas supplier 50 is in communication with the aperture 42 of the optical device 40, and the gas mixture 52 is blown to the chamber 10 through the aperture 42 of the optical device 40. In some embodiments, the target material supplier 20 is connected to a second side 102 of the chamber 10, and configured to supply the target material 22 to the chamber 10 from the second side 102. As shown in FIG. 2, the target material supplier 20 may supply the target material 22 to an irradiation region 14 in the chamber 10 from the second side 102, while the light source system 30 may emit the light beam L to the irradiation region 14 from the first side 101. In the irradiation region 14, the target material 22 is excited by the light beam L, generating plasma and EUV light.

In addition to generating the electromagnetic radiation 16 such as EUV light, undesirable plasma by-products also appear in the chamber 10. For example, the plasma by-products such as target material vapor may include neutral atoms and ions of the target material 22 when generating the EUV light. Also, debris of the target material 22 i.e., the target material 22 not excited by the light beam L would also appear in the chamber 10 when generating the EUV light. The debris, atoms and ions of the target material 22 tend to travel toward the optical device 40, and would deposit on the optical device 40 or the inner wall of the chamber when generating the EUV light. The debris, atoms and ions of the target material 22 deposited on the optical device 40 deteriorate the optical performance such as reflectivity of the optical device 40, and potentially damage the optical device 40. Particularly, the ions of the target material 22 having higher velocity and kinetic energy than the atoms of the target material 22, would seriously deteriorate the optical performance of the optical device 40, thereby reducing the efficiency of EUV light generation. In some embodiments, the apparatus 1 may further include a target material catcher 24 connected to the chamber 10, and configured to catch the remaining target material 22. The target material catcher 24, for example, may be connected to a third side 103 opposing to the first side 101 where the target material supplier 20 is disposed, so as to catch the remaining target material 22.

In view of the problems caused by plasma by-product and debris of the target material 22, a buffer gas supplier 50 is incorporated in the chamber 10. The buffer gas supplier 50 is connected to the chamber 10 and configured to introduce a gas mixture 52 to the chamber 10. The gas mixture 52 may include a first buffer gas reactive to the target material 22, and a second buffer gas configured to slow down debris of the target material 22 and/or plasma by-product. The first buffer gas can react with the debris of the target material 22, and produce a gaseous product. The gaseous product can be easily exhausted from the chamber 10 through one or more exhaust outlets 58, and thus the debris of the target material 22 can be reduced. In some embodiments, a pump (not shown) may be used to pump the gaseous product out of the chamber 10. In some embodiments, the target material 22 includes tin (Sn), and the first buffer gas includes hydrogen gas ($H_2$). Hydrogen gas is able to react with tin, forming gaseous tin hydride ($SnH_4$). The gaseous tin hydride can be exhausted from the chamber 10 by, e.g., a pump, such that the amount of tin debris can be reduced.

Refer to Table 1. Table 1 lists velocity and kinetic of neutral atoms and ions of tin during generating the EUV light in accordance with some embodiments of the present disclosure.

TABLE 1

| Plasma by-product | Velocity (Km/s) | Kinetic energy (KeV) |
| --- | --- | --- |
| Ions | 10-100 | 0.06-6 |
| Neutral atoms | 6-40 | 0.015-1 |

As listed in Table 1, the neutral atoms and ions of tin have high velocity and kinetic energy in the chamber 10. At such a high velocity, the reaction of the first buffer gas and the neutral atoms/ions of the target material 22 is less effective.

The second buffer gas is introduced in the chamber 10 to slow down debris of the target material 12 and/or plasma by-product. In some embodiments, the molecular mass of the second buffer gas is larger than that of the first buffer gas, so as to generate larger drag force than the first buffer gas. In some embodiments, the gas density of the second buffer gas is larger than that of the first buffer gas. In some embodiments, the viscosity of the second buffer gas is larger than that of the first buffer gas. The second buffer gas may include a noble gas, which does not react with the target material 22. By way of example, the second buffer gas may include xenon gas, argon gas, krypton gas, neon gas or a combination thereof.

Refer to Table 2. Table 2 lists molecular mass, gas density and viscosity of the first buffer gas (hydrogen gas), the target material (tin) and the second buffer gas (xenon) in accordance with some embodiments of the present disclosure.

TABLE 2

| | Molar mass | Gas density (g/L)@STP | Absolute Viscosity |
| --- | --- | --- | --- |
| $H_2$ | 2.01 | 0.089 | 0.88 ($10^{-5}$ Pa · s at 20° C.) |
| Sn | 118.71 | 5.299 | — |
| Xe | 131.29 | 5.894 | 2.28 ($10^{-5}$ Pa · s at 20° C.) |
| Ar | 39.95 | 1.783 | 2.23 ($10^{-5}$ Pa · s at 20° C.) |
| Ne | 20.18 | 0.90 | 3.13 ($10^{-5}$ Pa · s at 20° C.) |
| Kr | 83.80 | 3.749 | 2.53 ($10^{-5}$ Pa · s at 25° C.) |

As shown in Table 2, noble gas such as xenon gas (Xe), argon gas (Ar), krypton gas (Kr) or neon gas (Ne) has larger molecular mass than hydrogen gas ($H_2$), and thus has higher momentum than hydrogen gas when colliding tin. The larger molecular mass of the above noble gas also generates larger drag force than hydrogen gas Accordingly, noble gas such as xenon has better stopping effect on tin than hydrogen gas. Noble gas such as xenon gas has larger gas density than hydrogen gas, and thus the possibility of collision between xenon gas and tin is higher. Also, noble gas such as xenon has larger viscosity than hydrogen gas ($H_2$), and thus is more effective in slowing down tin than hydrogen gas.

A theoretic drag force of an object in a fluid can be obtained by means of a drag equation: $F_D = \frac{1}{2}\rho v C_D A$, where $F_D$ is the drag force;

ρ is the density of the fluid;

v is the velocity of the object relative to the fluid;

$C_D$ is a drag coefficient; and

A is the cross-sectional area.

As shown in Table 2, since the gas density of the second buffer gas is larger than that of the first buffer gas, the second buffer gas can provide a larger drag force on the target material 22 than the first buffer gas. For example, the drag force provided by xenon gas is about 66.2 times the drag force provided by hydrogen gas. Accordingly, the second buffer gas can help to slow down the high-speed and high-energy ions and atoms of tin during generation of EUV light. As a result, hydrogen gas can react with tin more efficiently, and deposition of the debris of tin and/or neutral atoms and ions of tin on the optical device can be reduced. In some embodiments, the second buffer gas can further help to carry the debris of tin and/or neutral atoms and ions of tin away from the optical device 40 as shown by arrows A, such that deposition of the debris of tin and/or neutral atoms and ions of tin on the optical device can be reduced.

Figure 2A:
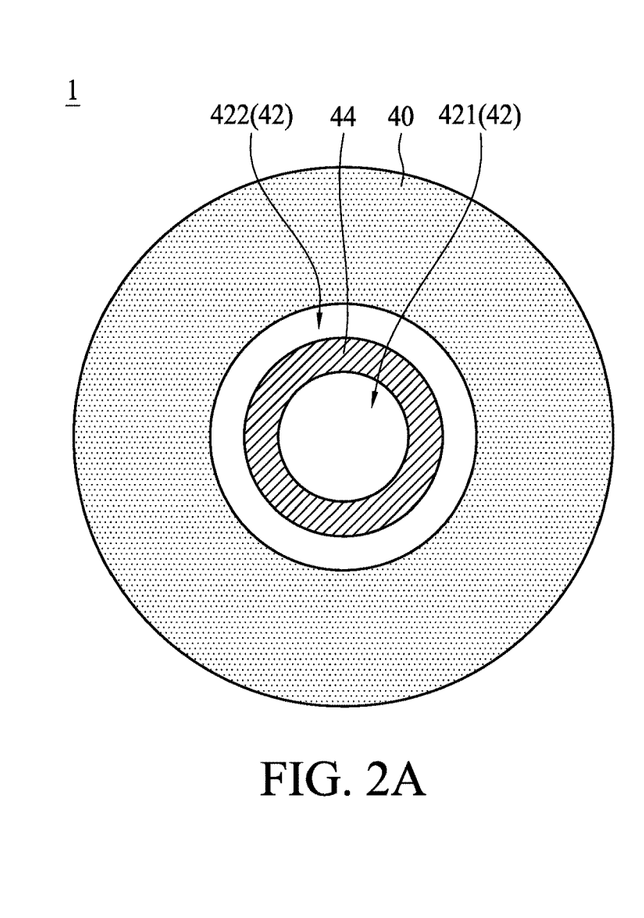
FIG. 2A is a schematic top view of an optical device in accordance with some embodiments of the present disclosure.
Figure 2B:
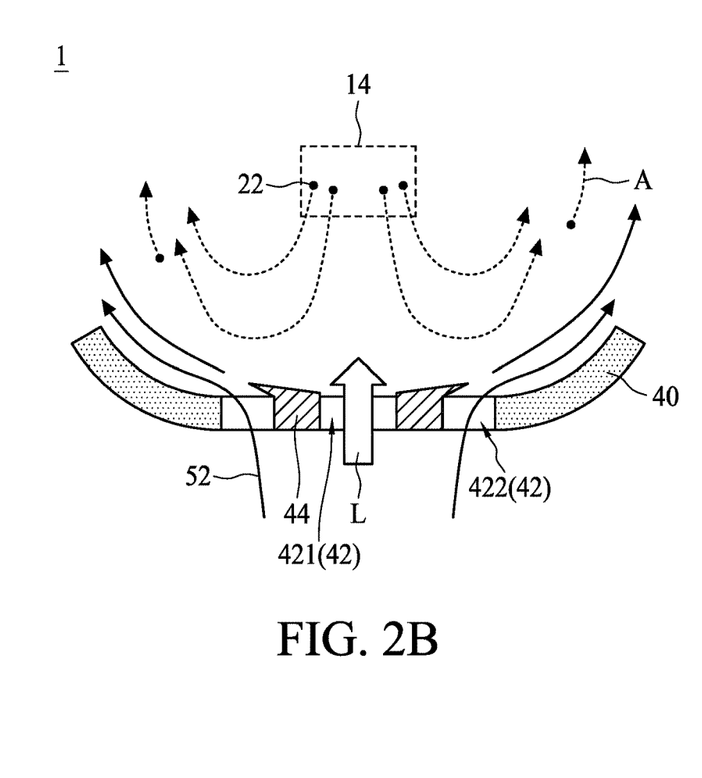
FIG. 2B is a schematic cross-sectional view of an optical device in accordance with some embodiments of the present disclosure.

Refer to FIG. 2, FIG. 2A and FIG. 2B. FIG. 2A is a schematic top view of an optical device in accordance with some embodiments of the present disclosure, and FIG. 2B is a schematic cross-sectional view of an optical device in accordance with some embodiments of the present disclosure. As shown in FIG. 2, FIG. 2A and FIG. 2B, the optical device 40 may include a reflector mirror, which can reflect the electromagnetic radiation 16, and focus the electromagnetic radiation 16 to a focus point. By way of example, the optical device 40 may include a multi-layer mirror (MLM) capable of reflecting EUV light within a designated wavelength range. In some embodiments, the optical device 40 may include an aperture 42 having a first sub-aperture 421 and a second sub-aperture 422. The first sub-aperture 421 may be disposed at an original point of the reflector mirror, and the light beam L can emit to the chamber 10 through the first sub-aperture 421, exciting the target material 22. The second sub-aperture 422 may be disposed adjacent to the first sub-aperture 421, and the gas mixture 52 may be introduced into the chamber 10 through the second sub-aperture 422. In some embodiments, the second sub-aperture 42 may have an annular shape surrounding the first sub-aperture 421, such that the gas mixture 52 can be introduced into the chamber 10 more uniformly. In some embodiments, the first sub-aperture 421 and the second sub-aperture 422 may be divided by a baffle 44. In some other embodiments, the first sub-aperture 421 and the second sub-aperture 422 may be connected to each other. The baffle 44 may be configured to direct the flow of the gas mixture 52 to increase the ability of retarding the debris of the target material and/or the plasma by-product. For example, the baffle 44 may include an inclined edge extending outwardly, such that the flow of the gas mixture 52 can be directed outwardly. In some embodiments, the gas mixture 52 can provide a gas curtain over the optical device 40, preventing the debris of the target material and/or the plasma by-product from falling on the surface of the optical device 40. The baffle 44 may also be configured to reduce the cross-sectional area of the second sub-aperture 422 to increase the velocity of the gas mixture 52 when entering the chamber 10.

Figure 3:
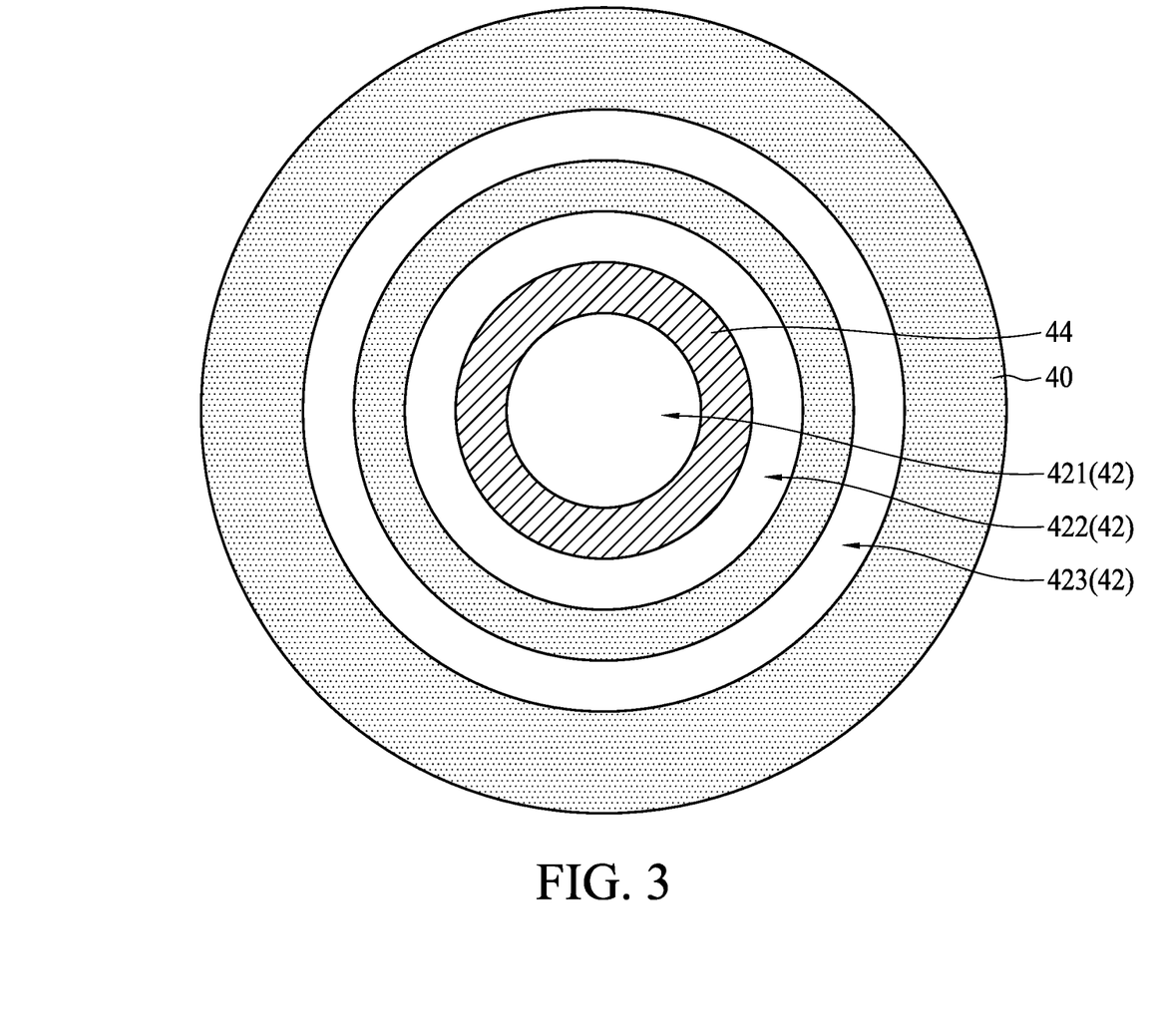
FIG. 3 is a schematic top view of an optical device in accordance with some embodiments of the present disclosure.

Refer to FIG. 3. FIG. 3 is a schematic top view of an optical device in accordance with some embodiments of the present disclosure. As shown in FIG. 3, in some other embodiments, the optical device 40 may include an aperture 42 having a first sub-aperture 421, a second sub-aperture 422 and a third sub-aperture 423. The first sub-aperture 421, the second sub-aperture 422 and the third sub-aperture 423 may be configured to allow light beam and different gases passing, respectively. In some embodiments, the light beam L can emit to the chamber 10 through the first sub-aperture 421. The second sub-aperture 422 and the third sub-aperture 423 may be arranged adjacent to the first sub-aperture 421 in the radial direction, and configured to introduce different gases. By way of example, the first buffer gas may be introduced through the second sub-aperture 422, and the second buffer gas may be introduced through the third sub-aperture 423, or vice versa.

Figure 4:
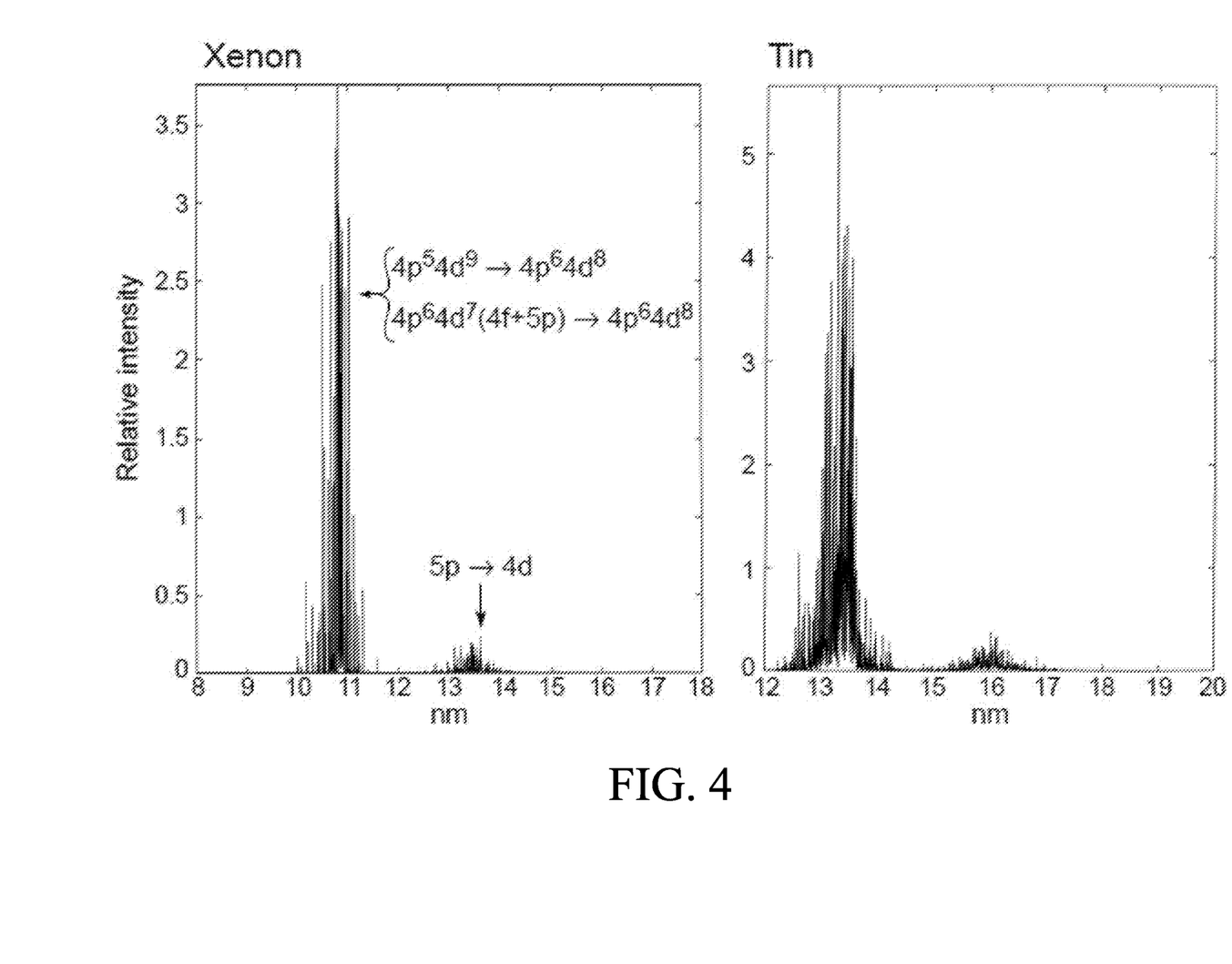
FIG. 4 shows an EUV spectrum excited by a light beam in accordance with some embodiments of the present disclosure.

Refer to FIG. 4. FIG. 4 shows an EUV spectrum excited by a light beam in accordance with some embodiments of the present disclosure. As shown in FIG. 4, tin, can be used as a target material and excited by a light beam such as a $CO_2$ laser beam to generate an EUV light having a wavelength of about 13.5 nm. The EUV light having a wavelength of about 13.5 nm can be delivered to an exposure light source system in a photolithography apparatus. In some embodiments, xenon gas is used as a buffer gas and introduced to slow down debris of the target material and/or plasma by-product. Xenon gas, however, can also be excited by the light beam to generate an EUV light. The EUV light generated by xenon gas may have a wavelength range with two peaks, where one of the peaks has a wavelength of about 13.5 nm. Thus, using xenon gas as the buffer gas not only can help to slow down debris of the target material and/or plasma by-product, but also can help to increase the amount of EUV light.

The amount the first buffer gas and the second buffer gas can be modified based on different considerations. For example, the amount of the first buffer gas can be increased to enhance the reaction between the first buffer gas and the target material. The amount of the second buffer gas can be increased to enhance its ability to slow down the plasma by-product, and to increase the amount of EUV light. In some embodiments, the amount ratio of the second buffer gas to the first buffer gas is less than 1, but is not necessarily limited thereto. By way of example, the amount ratio of the second buffer gas to the first buffer gas is ranging from about 0.0001% to about 50%, ranging from about 0.001% to about 50%, ranging from about 0.01% to about 50%, ranging from about 0.1% to about 50%, ranging from about 1% to about 50%, or ranging from about 5% to about 50%, ranging from about 10% to about 50%, but is not limited thereto.

The apparatus for generating an electromagnetic radiation is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 5:
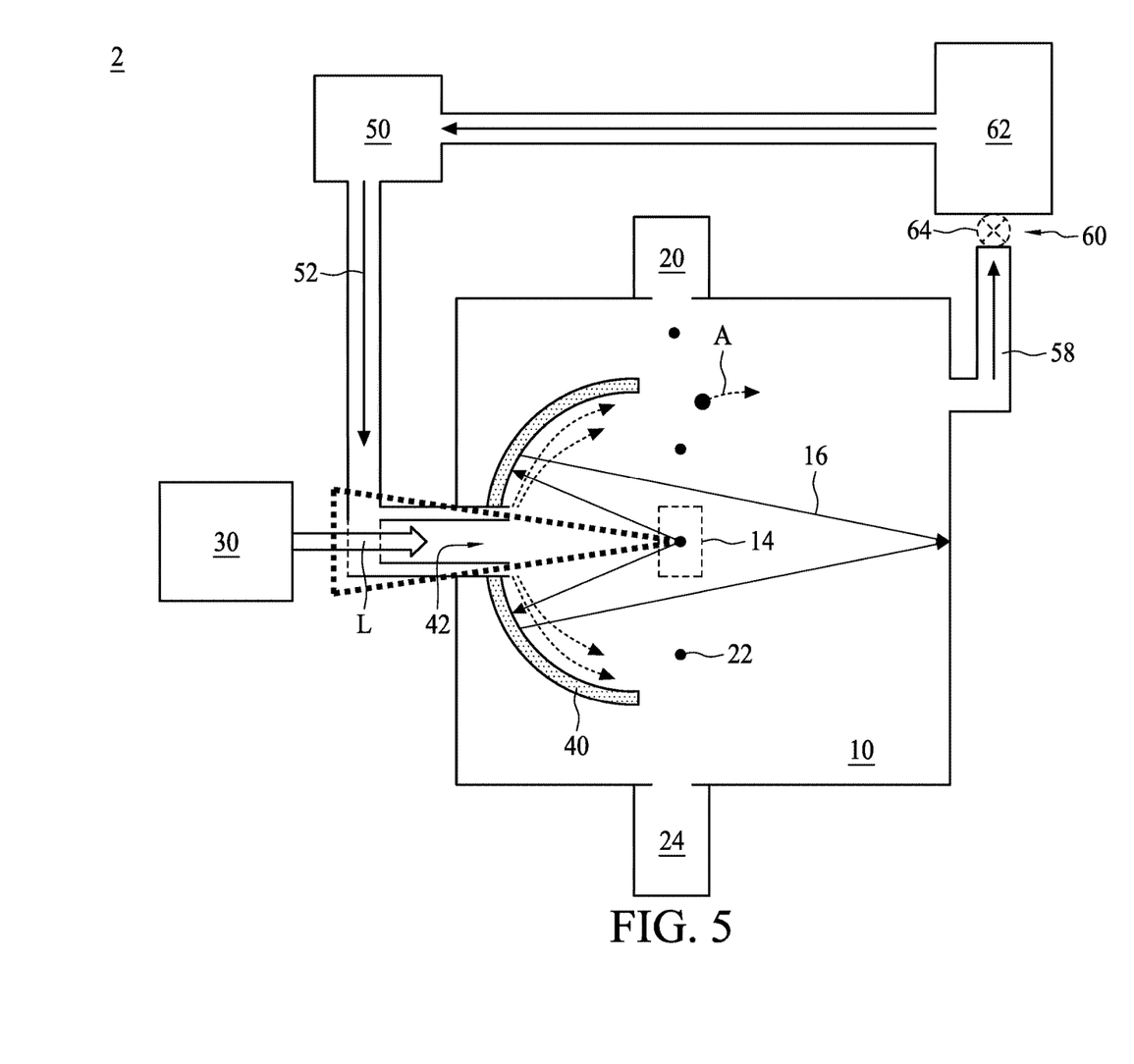
FIG. 5 is a schematic diagram illustrating an apparatus in accordance with some embodiments of the present disclosure.

FIG. 5 is a schematic diagram illustrating an apparatus in accordance with some embodiments of the present disclosure. As shown in FIG. 5, the apparatus 2 for generating an electromagnetic radiation 16 includes a chamber 10, a target material supplier 20, a light source system 30, an optical device 40, a buffer gas supplier 50 and a recycle system 60. The apparatus 2 may be designed to generate an electromagnetic radiation such as an EUV light. By way of example, an EUV light having a wavelength of about 13.5 nm can be generated.

The target material supplier 20 is connected to the chamber 10 and configured to supply a target material 22 to the chamber 10. The target material 22 may include tin, and the EUV light having a wavelength of about 13.5 nm can be generated. The target material 22 may be introduced to the chamber 10 in the form of a droplet, a stream, a cluster or the like.

The light source system 30 is configured to emit a light beam L on the target material 22. The target material 22 can be excited by the light beam L, thereby being converted into a plasma state, with electromagnetic radiation 16 within EUV wavelength range. In some embodiments, the light beam L may include a pulse light. In some embodiments, the light source system 30 may include a laser source system 30 configured to emit a laser beam. The laser beam may include, for example, $CO_2$ laser or the like. The wavelength of $CO_2$ laser may be within a middle infra-red wavelength range, e.g., within the range of about 9 micrometers to about 11 micrometers. $CO_2$ laser may produce a relatively high conversion efficiency on some target material such as tin.

The optical device 40 is disposed in the chamber 10 and configured to collect the electromagnetic radiation 16. In some embodiments, the optical device 40 can collect and direct the electromagnetic radiation 16 toward an exposure light source system in a photolithography apparatus. In some embodiments, the optical device 40 may include a reflector mirror such as a multi-layer mirror (MLM) capable of reflecting EUV light within a designated wavelength range. The buffer gas supplier 50 is connected to the chamber 10 and configured to introduce a gas mixture 52 to an irradiation region 14 in the chamber 10. In some embodiments, the apparatus 2 may further include a target material catcher 24 connected to the chamber 10, and configured to catch the remaining target material 22.

The recycle system 60 is connected to the chamber 10 through an exhaust outlet 58 for example, and connected to the buffer gas supplier 50, and configured to recycle the gas mixture 52. In some embodiments, the recycle system 60 includes a filtration unit 62 such as a membrane filtration unit to filter the debris of the target material 22. In some embodiments, a flow control component 64 such as a valve may be installed in the recycle system 60 to control the flow of gas mixture 52. The gas mixture 52 may be recycled and delivered to the buffer gas supplier 50 for reuse. In some embodiments, the first buffer gas such as hydrogen gas can be filtered, while the second buffer gas such as xenon gas is recycled.

In some embodiments of the present disclosure, an apparatus for generating an electromagnetic radiation such as EUV light is provided. The apparatus includes a buffer gas supplier for introducing a gas mixture into the chamber during operation of generating the EUV light. The gas mixture includes a first buffer gas and a second buffer gas. The first buffer gas is configured to react with a target material to form a gaseous product, which can be exhausted from the chamber to reduce deposition of the debris on an optical device and/or on the inner wall of the chamber. The second buffer gas having a larger molecular mass, gas density and viscosity than that of the first buffer gas, and is configured to help slow down debris of the target material and/or plasma by-product, so as to increase the reaction efficiency of the target material and the first buffer gas, and to reduce deposition of the target material and/or plasma by-product. The second buffer gas can also be excited to emit an EUV light, and thus also help to increase the amount of EUV light.

In some embodiments, a method for generating an electromagnetic radiation includes the following operations. A target material is introduced in a chamber. A light beam is irradiated on the target material in the chamber to generate plasma and an electromagnetic radiation. The electromagnetic radiation is collected with an optical device. A gas mixture is introduced in the chamber through a gas outlet which extends into the optical device through an aperture. The gas mixture includes a first gas reactive to the target material, and a second gas to slow down debris of the target material and/or plasma by-product.

In some embodiments, an apparatus is provided. The apparatus includes a chamber, an optical device in the chamber, and a gas supplier connected to the chamber. The optical device includes an aperture. The gas supplier is configured to introduce a gas mixture to the chamber. The gas supplier includes a gas outlet extended into the optical device through the aperture.

In some embodiments, an apparatus is provided. The apparatus includes a chamber, a light source system, an optical device in the chamber and a gas supplier connected to the chamber. The light source system is configured to emit a light beam on a target material in the chamber to generate plasma and an electromagnetic radiation. The optical device is configured to collect the electromagnetic radiation. The optical device includes an aperture. The gas supplier is configured to blow a gas mixture through the aperture of the optical device. The gas supplier includes a gas outlet extended into the optical device through the aperture.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for generating an electromagnetic radiation, comprising:
   introducing a target material in a chamber;
   irradiating a light beam on the target material in the chamber to generate plasma and an electromagnetic radiation;
   collecting the electromagnetic radiation with an optical device; and
   introducing a gas mixture in the chamber through a gas outlet which extends into the optical device through an aperture, the gas mixture comprises a first gas reactive to the target material, and a second gas to slow down debris of the target material and/or plasma by-product, wherein the gas outlet is in contact with the optical device.

2. The method of claim 1, wherein the gas mixture is introduced in the chamber through the aperture of the optical device.

3. The method of claim 1, wherein a molecular mass of the second gas is larger than that of the first gas and that of the target material.

4. The method of claim 1, wherein the target material includes tin, the first gas comprises hydrogen gas, the second gas comprises xenon gas, and an amount ratio of the second gas to the first gas is less than 1.

5. An apparatus, comprising:
   a chamber;
   an optical device in the chamber, wherein the optical device comprises an aperture; and
   a gas supplier connected to the chamber and configured to introduce a gas mixture to the chamber, wherein the gas supplier comprises a gas outlet extended into the optical device through the aperture, and the gas outlet is in contact with the optical device.

6. The apparatus of claim 5, wherein the gas outlet is connected to a first side of the chamber, and the gas mixture is introduced to the chamber from the first side.

7. The apparatus of claim 6, further comprising a light source system disposed on the first side of the chamber and configured to emit a light beam into the chamber from the first side.

8. The apparatus of claim 7, wherein the optical device is disposed near the first side of the chamber, and the light beam is emitted to the chamber through the aperture of the optical device.

9. The apparatus of claim 6, further comprising a target material supplier connected to a second side of the chamber, and configured to supply a target material to the chamber from the second side.

10. The apparatus of claim 5, wherein the gas outlet of the gas supplier is in communication with the aperture of the optical device, and the gas mixture is introduced to the chamber through the aperture of the optical device.

11. The apparatus of claim 5, wherein the gas mixture comprises a first gas and a second gas, and a molecular mass of the second gas is larger than that of the first gas.

12. The apparatus of claim 11, wherein a gas density of the second gas is larger than that of the first gas.

13. The apparatus of claim 11, wherein a viscosity of the second gas is larger than that of the first gas.

14. The apparatus of claim 11, wherein the first gas includes hydrogen gas.

15. The apparatus of claim 11, wherein the second gas includes a noble gas.

16. The apparatus of claim 15, wherein the second gas includes xenon gas, argon gas, krypton gas, neon gas or a combination thereof.

17. The apparatus of claim 5, further comprising a recycle system connected to the chamber and the gas supplier, and configured to recycle the gas mixture.

18. An apparatus, comprising:
a chamber;
a light source system configured to emit a light beam on a target material in the chamber to generate plasma and an electromagnetic radiation;
an optical device in the chamber and configured to collect the electromagnetic radiation, wherein the optical device includes an aperture; and
a gas supplier connected to the chamber and configured to blow a gas mixture through the aperture of the optical device, wherein the gas supplier comprises a gas outlet extended into the optical device through the aperture, and the gas outlet is in contact with the optical device.

19. The apparatus of claim 18, wherein the gas mixture comprises a first gas reactive to the target material, and a second gas having a molecular mass larger than that of the target material to carry down debris of the target material and/or plasma by-product away from the optical device, the molecular mass of the second gas is larger than that of the first gas, a gas density of the second gas is larger than that of the first gas, and a viscosity of the second gas is larger than that of the first gas.

20. The apparatus of claim 19, wherein the first gas includes hydrogen gas, and the second gas includes xenon gas, argon gas, krypton gas, neon gas or a combination thereof.

* * * * *